United States Patent
Yu

[11] Patent Number: 6,143,652
[45] Date of Patent: Nov. 7, 2000

[54] METHOD FOR FORMING METALLIC LAYER USING INSPECTED MASK

[75] Inventor: Chia-Chieh Yu, Taipei, Taiwan

[73] Assignee: United Semiconductor Corporation, Hsinchu, Taiwan

[21] Appl. No.: 09/063,672

[22] Filed: Apr. 21, 1998

[30] Foreign Application Priority Data

Feb. 20, 1998 [TW] Taiwan ................................. 87102398

[51] Int. Cl.[7] ...................... H01L 21/44; H01L 21/4763; B44C 1/22; G03C 5/00
[52] U.S. Cl. ........................... 438/660; 216/12; 216/102; 216/105; 430/313; 430/314; 430/318; 438/661; 438/663; 438/669; 438/632; 438/636; 438/687; 438/688; 438/725
[58] Field of Search ...................... 438/660–661, 438/663, 669, 671, 636, 632, 725, 687, 688, 942, 946, 947, 952, 955, FOR 103; 216/12, 13, 102, 105; 430/313, 314, 318

[56] References Cited

U.S. PATENT DOCUMENTS 5,750,439   5/1998   Naito ....................................... 438/648
5,759,868   6/1998   Ogawa et al. ........................... 437/195
5,895,265   4/1999   Inoue et al. .............................. 438/643

OTHER PUBLICATIONS

Webster's II dictionary, published by Houghton Mifflin Company, 1995.

Primary Examiner—John F. Niebling
Assistant Examiner—Ha Tran Nguyen
Attorney, Agent, or Firm—Christie, Parker & Hale, LLP

[57] ABSTRACT

A method for forming a high-quality aluminum-copper alloy pattern over a semiconductor substrate. The method first forms an aluminum-copper alloy layer over a semiconductor substrate, and then performs a rapid thermal processing operation to remelt copper extracts into the alloy bulk. Subsequently, a photoresist layer is formed over the alloy layer. Finally, the alloy layer is etched to transfer the pattern from the photoresist layer to the metallic alloy layer. Unlike a conventional method that can lead to abnormal conduction due to the presence of extracts that are difficult to etch, this invention uses a thermal operation to remove the extracts before etching is conducted. Hence, the masking effect due to etching is mostly prevented.

22 Claims, 2 Drawing Sheets

METHOD FOR FORMING METALLIC LAYER USING INSPECTED MASK

CROSS-REFERENCE TO RELATED APPLICATION

This application claims the priority benefit of Taiwan application serial no. 87102398, filed Feb. 20, 1998, the full disclosure of which is incorporated herein by reference.

BACKGROUND OF THE INVENTION

1. Field of Invention

The present invention relates to a method for forming a metallic layer. More particularly, the present invention relates to a method of forming a metallic layer capable of preventing a masking effect during subsequent etching operation.

2. Description of Related Art

Aluminum is a commonly used conductive material in the fabrication of VLSI circuits. Besides having a low material cost and a good electrical conductivity, aluminum is easy to deposit and etch, and has good adhesive strength with silicon as well. Therefore, aluminum is often used as a runner for semiconductor devices. However, as the level of integration for semiconductor devices is increased, the use of aluminum as a runner for semiconductor devices poses some problems. First, when the line-width of an aluminum wire is narrowed because of device miniaturization, electrormigration will occur and will ultimately lead to an open aluminum wire. Secondly, since aluminum has a definite solid solubility in silicon, aluminum and silicon can inter-diffuse quite easily when heated to a moderately high temperature. Hence, spikes can easily form at their junction interface. Consequently, it is normal to employ an alloy, which is a blend of copper and aluminum, as the material for forming the runners in order to reduce electromigration and spiking problems.

In general, aluminum-copper alloy is used in conventional fabrication processes because extracts of copper inside the alloy are able to lower the rate of electromigration in aluminum. However, when there are too many copper extracts or the size of each individual copper extract is too big, undesirable effects such as the masking effect can easily occur. Normally, when the alloy is heated to a temperature above 120° C., the quantity of copper extracts will start to increase while the size of each extract will grow. The situation is particularly critical when the metallic layer needs to be reworked after finding some defects in an after develop inspection (ADI). In rework processing, the photoresist layer needs to be removed and the surface thoroughly cleaned using plasma. All the while, the copper extracts within the metallic alloy will also grow larger, thus intensifying the masking effect. One method of solving the problem is to use a chemical formula having a lower selectivity ratio to etch the wafer and then using a highly energetic beam of ions to bombard and remove the copper extracts. However, as the current trend is towards a more precise fabricating process, which means a higher etching selectivity ratio and a thinner photoresist layer, the above method has definite limitations.

FIG. 1 is a block diagram showing the conventional manufacturing flow for forming a metallic layer. In FIG. 1, label 10 represents the step of forming a layer of aluminum-copper alloy, label 12 represents the step of forming a layer of photoresist, label 14 represents the step of developing the photoresist layer, label 16 represents the step of performing an after development inspection, label 18 represents the step of performing subsequent processing operations and label 13 represent the step of removing the photoresist layer. Fabrication of the metallic layer includes first forming a metallic layer 10 over a semiconductor substrate having a MOS devices already formed thereon, where the metallic layer can be aluminum-copper alloy functioning as multilevel interconnect. Before the formation of a photoresist layer 12, an anti-reflection layer can be deposited over the metallic layer 10. The photoresist layer 12 is formed over the metallic layer 10 and then the photoresist layer 12 is developed 14. Subsequently, an after development inspection 16 is carried out to ensure a proper photolithographic operation has been performed. If the outcome of the inspection 16 is satisfactory, subsequent photolithographic and etching operations 18 are carried out. On the other hand, if the quality after inspection 16 is unsatisfactory, the photoresist layer will be removed 13 the surface of the wafer will be cleaned using plasma. The whole procedure of photoresist layer formation 12, photoresist development 14 and inspection 16 will be repeated. However, as the temperature increases to between 120° C. to 350° C., a large quantity of copper extracts will emerge and each extract will grow in size, too. The increase in copper extracts is considerable especially when rework is needed and the photoresist layer must be removed 13 due to a poor development 14. In a subsequent processing step 18 as shown in FIG. 1, when the aluminum-copper alloy is dry-ctchcd, the chlorine plasma used in the etching operation can react with the copper extracts in the alloy to form copper chloride compound. Since copper chloride is non-volatile, its removal is very difficult and can easily lead to a masking effect.

In light of the foregoing, there is a need to improve the method of forming metallic layer on a semiconductor wafer.

SUMMARY OF THE INVENTION

Accordingly, the present invention is to provide a method for forming a metallic layer that can avoid masking effects when aluminum-copper alloy is etched. Hence, product reliability can be increased and defective rate can be lowered.

To achieve these and other advantages and in accordance with the purpose of the invention, as embodied and broadly described herein, the invention provides a method for forming a metallic layer. The method comprises the steps of forming an alloy layer over a semiconductor substrate having MOS devices already formed thereon. Thereafter, a thermal processing operation is performed. Next, a photoresist layer is formed over the alloy layer and then patterned. Subsequently, an etching operation is carried out, transferring the pattern on the photoresist layer onto the alloy layer. Finally, the photoresist layer is removed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1. is a block diagram showing the conventional manufacturing flow for forming a metallic layer.

DESCRIPTION OF THE PREFERRED EMBODIMENTS

Figure 1:
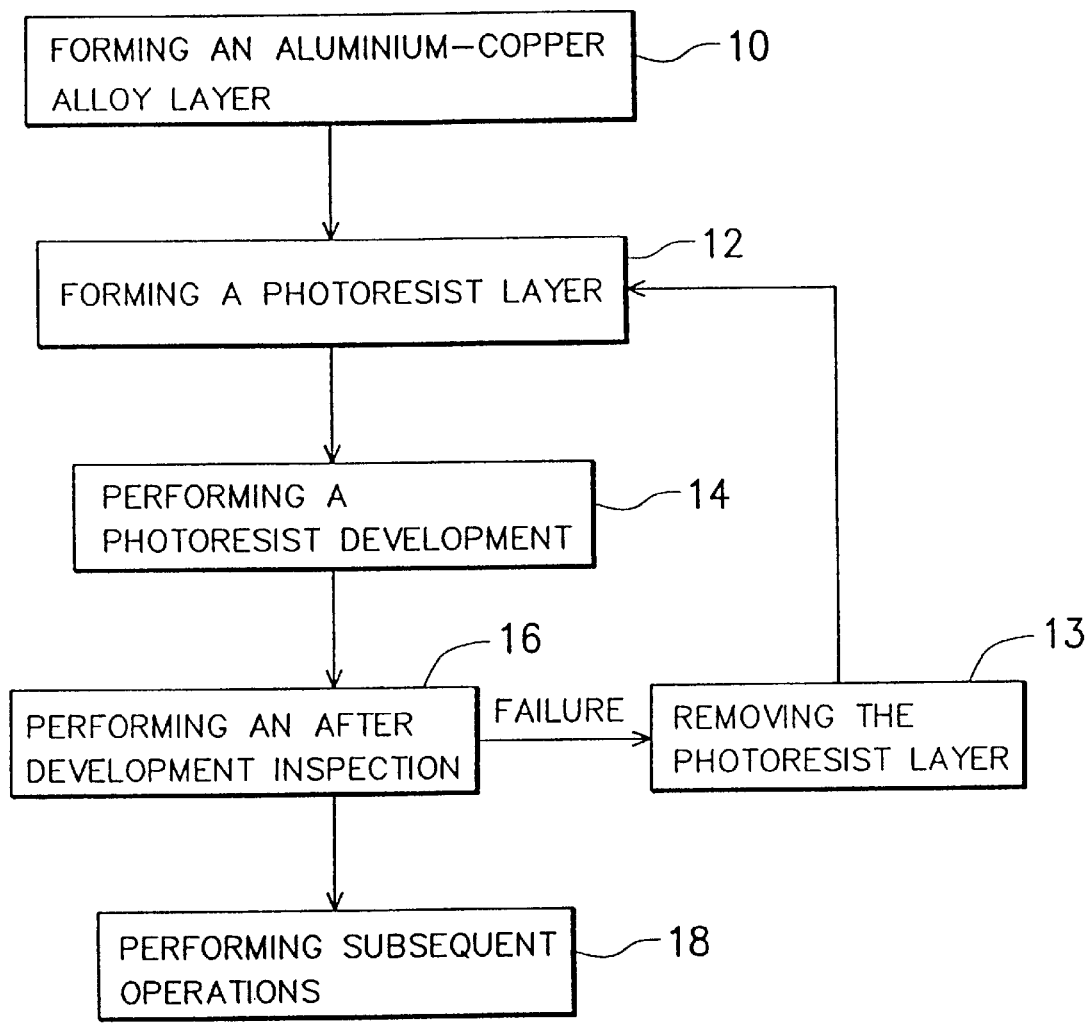

Reference will now be made in detail to the present preferred embodiments of the invention, examples of which are illustrated in the accompanying drawings. Wherever possible, the same reference numbers are used in the drawings and the description to refer to the same or like parts.

Figure 2:
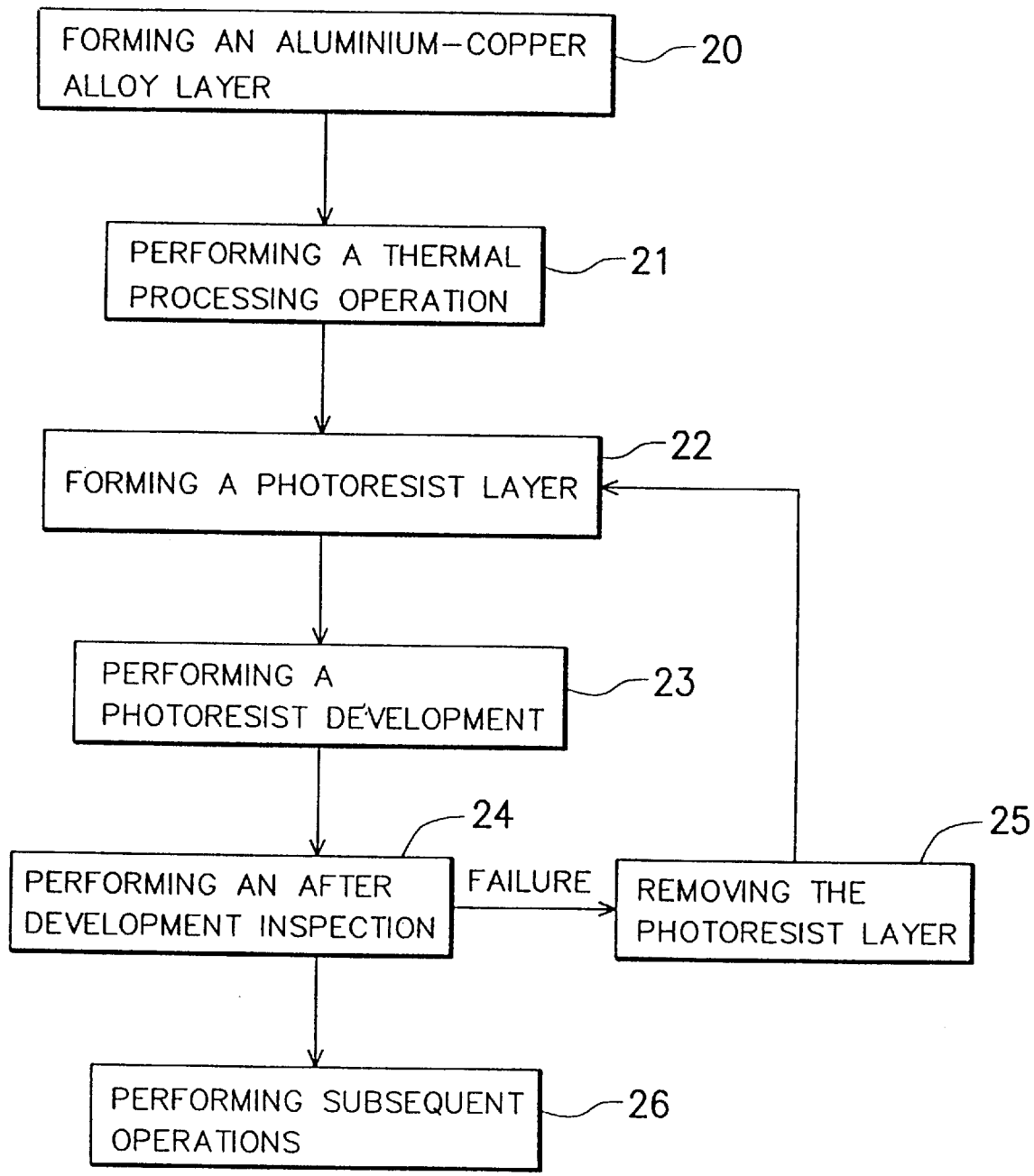
FIG. 2 is a block diagram showing the manufacturing flow for forming a metallic layer according to one preferred embodiment of this invention.

When an alloy is used to form a metallic interconnect layer, most often one or a few of the ingredients in the alloy will form extracts, making their etch-removal particularly difficult. Without good alloy etching, an improper conductive channel can be formed. Therefore, methods of fabricating an alloy layer that can prevent the formation of extracts are highly desirable as far as alloy etching is concerned. This invention provides a method for forming a metallic alloy layer that can prevent a masking effect when the metallic alloy layer is etched. FIG. 2 is a block diagram showing the manufacturing flow for forming a metallic layer according to one preferred embodiment of this invention. In FIG. 2, label 20 represents the step of forming a layer of aluminum-copper alloy, label 21 represents the step of performing a thermal processing operation, label 22 represents the step of forming a layer of photoresist, label 23 represents the step of developing the photoresist layer, label 24 represents the step of performing an after development inspection, label 26 represents the step of performing subsequent processing operations and label 25 represent the step of removing the photoresist layer. Fabrication of the metallic layer includes first forming an alloy layer in step 20 over a semiconductor substrate having MOS devices already formed thereon, where the alloy layer can be an aluminum-copper alloy mixed in a ratio of 2:1, or an aluminum-copper-silicon alloy or other alloys having similar properties, for example. The alloy layer is used to form multilevel interconnects. Because a large quantity of copper extracts appear and grow in size whenever the wafer is heated to between 120° C. to 350° C., a thermal processing operation 21 is carried out before the photoresist layer is formed over the alloy layer. The thermal processing operation can be a rapid thermal processing (RTP), or simply heating the wafer on a hot plate to a temperature of about 350° C. so that the extracted copper re-melts back into the alloy bulk.

Furthermore, it is preferable to form an anti-reflection layer on top of the alloy layer in order to prevent reflected light coming from the metallic surface from interfering with photoresist exposure. Consequently, an anti-reflection layer such as titanium nitride can be coated on top of the metallic layer before the thermal processing operation of step 21 is actually carried out.

After the copper extracts are re-melted back to the alloy bulk, a photoresist layer is formed over the metallic layer in step 22. Next, the photoresist layer is developed in step 23, thereby forming a pattern on the photoresist layer. Subsequently, before carrying out the etching operation in step 26, the quality of the developed pattern on the photoresist layer is checked in an after development inspection step 24. If defects are found in the inspection 24, reworking is necessary. The photoresist layer on a rework wafer is stripped from the wafer surface in step 25 and the surface is cleaned using plasma. Thereafter, another thermal processing operation 21 is conducted using a rapid thermal processing (RTP) or simply heating the wafer in a hot plate to a temperature of about 350° C. Then, another photoresist layer is formed in step 22 followed by its development in step 23.

When the after development inspection 24 is complete and the quality of the photoresist development is ensured, a subsequent etching operation is performed in step 26. Normally, aluminum-copper alloy is dry etched using chloride plasma. In the presence of copper extracts, copper and chloride will react to form a non-volatile compound, which is very difficult to remove. Consequently, a masking effect will occur. However, in this invention, the copper extracts have already been re-melted back into the alloy before the photoresist layer 22 is formed. Therefore, there are no copper extracts reacting with chlorides to form non-volatile compound in subsequent etching operation. Hence, product reliability can be increased and defect rate can be lowered.

After the etching operation 26, the photoresist layer above the metallic layer is removed. The wafer surface is then cleaned using plasma. Because plasma cleaning is conducted at a temperature in the range of 120° C. to 350° C., a portion of the copper will form extracts again. However, etching is already completed by this time, and the presence of copper extracts can contribute positively to the reduction of the electromigration of the metallic alloy.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a metallic layer comprising:
    (a) providing a semiconductor substrate having a MOS device already formed thereon;
    (b) forming a copper-containing alloy layer over the semiconductor substrate after step (a);
    (c) performing a thermal processing operation at a temperature in the range of 120° C. to about 350° C. after step (b);
    (d) forming a photoresist layer over the alloy layer and then patterning the photoresist layer after step (c);
    (e) performing an etching operation to transfer the pattern from the photoresist layer to the alloy layer after step (d); and
    (f) removing the photoresist layer after step (e).

2. The method of claim 1, wherein the ingredients of the alloy include at least copper and aluminum.

3. The method of claim 1, which further includes forming an anti-reflection layer between step (b) and step (c).

4. The method of claim 3, wherein the step of forming the anti-reflection layer includes depositing a titanium nitride layer.

5. The method of claim 1, wherein the step of performing the thermal processing operation includes a rapid thermal processing.

6. The method of claim 1, wherein the step of performing the thermal processing operation includes heating the semiconductor substrate in a hot plate to a temperature of about 350° C.

7. The method of claim 1, wherein after step (d), further includes an after development inspection on the patterned photoresist layer.

8. The method of claim 1, further comprising determining if the photoresist layer is defective after step (d) and, if defective, removing the defective photoresist layer and then repeating steps (c) and (d) of claim 1.

9. A method for manufacturing a metallic layer comprising the steps of:
    (a) providing a semiconductor substrate having an MOS device already formed thereon;

(b) forming an alloy layer comprising at least copper and aluminum over the semiconductor substrate after step (a);

(c) performing a thermal process operation for re-melting any copper extracts into the alloy layer after step (b);

(d) forming a patterned photoresist layer having a pattern over the alloy layer after step (c);

(e) checking the pattern and repeating steps (c) to (e) if the pattern is found to be defective after step (d);

(f) performing an etching operation to transfer the pattern from the photoresist layer to the alloy after step (e); and (g) removing the photoresist layer after step (f).

10. The method of claim 9, wherein the ingredients of the alloy includes at least copper and aluminum.

11. The method of claim 9, which further includes forming an anti-reflection layer between step (b) and step (c).

12. The method of claim 11, wherein the step of forming the anti-reflection layer includes depositing a titanium nitride layer.

13. The method of claim 9, wherein the step of performing the thermal processing operation includes a rapid thermal processing.

14. The method of claim 9, wherein the step of performing the thermal processing operation includes heating the semiconductor substrate in a hot plate to a temperature of about 350° C.

15. The method of claim 9, wherein the step of checking the photoresist pattern includes an after development inspection.

16. A method for forming a metallic layer capable for depositing an aluminum-copper alloy layer over a semiconductor substrate such that the quality of the alloy layer after a pattern etching operation can still be maintained, the method comprising:

(a) forming an aluminum-copper alloy layer over the semiconductor substrate l;

(b) performing a thermal processing operation for removing any copper extracts from the aluminum-copper alloy layer that could interfere with a subsequent etching operation after step (a);

(c) forming an etching mask over the aluminum-copper alloy layer, where the etching mask is developed to form the desired etching pattern after step (b); additionally carrying out a quality control check to ensure the quality of the patterned etching mask; whenever the quality control check reveals a defective etching mask, removing the defective etching mask and repeating steps (b) and (c); and (d) performing the etching process after step (c).

17. The method of claim 16, wherein the ingredients of the alloy include at least copper and aluminum.

18. The method of claim 16, which further includes forming an anti-reflection layer before performing the thermal processing operation.

19. The method of claim 18, wherein the step of forming the anti-reflection layer includes depositing a titanium nitride layer.

20. The method of claim 16, wherein the step of performing the thermal processing operation includes a rapid thermal processing.

21. The method of claim 16, wherein the step of performing the thermal processing operation includes heating the semiconductor substrate in a hot plate to a temperature of about 350° C.

22. The method of claim 16, wherein the step of forming the etching mask includes depositing a photoresist layer.

* * * * *